US010790811B2

(12) United States Patent
Lee et al.

(10) Patent No.: US 10,790,811 B2
(45) Date of Patent: Sep. 29, 2020

(54) CASCADED BOOTSTRAPPING GAN POWER SWITCH AND DRIVER

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US); Michael A. de Rooij, Playa Vista, CA (US); Robert Beach, La Crescenta, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/553,335

(22) Filed: Aug. 28, 2019

(65) Prior Publication Data

US 2020/0076415 A1    Mar. 5, 2020

Related U.S. Application Data

(60) Provisional application No. 62/723,864, filed on Aug. 28, 2018.

(51) Int. Cl.
*H03K 17/06* (2006.01)
*H01L 29/20* (2006.01)
(Continued)

(52) U.S. Cl.
CPC ....... *H03K 17/063* (2013.01); *H01L 29/2003* (2013.01); *H01L 29/7787* (2013.01); *H03K 17/687* (2013.01)

(58) Field of Classification Search
CPC .. G11B 5/00; G11B 5/02; G11B 5/022; H01L 29/00; H01L 29/2003; H01L 29/7787; (Continued)

(56) References Cited

U.S. PATENT DOCUMENTS

| 5,969,964 A | * | 10/1999 | Mangtani | .............. | H02M 7/538 363/132 |
| 8,710,875 B2 | * | 4/2014 | Bai | ..................... | H02M 3/1588 323/284 |

(Continued)

FOREIGN PATENT DOCUMENTS

EP    1 911 037 B1    9/2009

*Primary Examiner* — Lincoln D Donovan
*Assistant Examiner* — Dave Mattison
(74) *Attorney, Agent, or Firm* — Blank Rome LLP

(57) ABSTRACT

A cascaded bootstrapping gate driver configured to provide quick turn-on of a high side power FET and low static current consumption. The cascaded bootstrapping gate driver includes an initial bootstrapping stage with a resistor to decrease static current consumption during transistor turn-off. A secondary bootstrapping stage is driven by the initial bootstrapping stage and includes a GaN FET transistor with a low on resistance in place of the resistor. The source terminal of the GaN FET transistor provides a gate driving voltage to the high side power switch FET. The low on-resistance of the GaN FET transistor provides quick turn-on of the high side power FET. Transistors in the cascaded bootstrapping gate driver are preferably enhancement mode GaN FETs and may be integrated into a single semiconductor die.

16 Claims, 8 Drawing Sheets

(51) Int. Cl.
*H01L 29/778* (2006.01)
*H03K 17/687* (2006.01)

(58) Field of Classification Search
CPC .. H03K 17/00; H03K 17/063; H03K 17/0822; H03K 17/64; H03K 17/662; H03K 17/687
USPC .......................................................... 327/110
See application file for complete search history.

(56) References Cited

U.S. PATENT DOCUMENTS

| | | | |
|---|---|---|---|
| 10,170,922 B1* | 1/2019 | Kinzer | H01L 23/49575 |
| 2003/0164728 A1 | 9/2003 | Blodgett | |
| 2008/0253151 A1* | 10/2008 | Bahramian | H02M 1/08 |
| | | | 363/22 |
| 2014/0167069 A1* | 6/2014 | Vielemeyer | H01L 27/0629 |
| | | | 257/77 |
| 2015/0035581 A1* | 2/2015 | Zojer | H03K 17/16 |
| | | | 327/382 |
| 2016/0105173 A1* | 4/2016 | De Rooij | H03K 17/6871 |
| | | | 327/109 |
| 2017/0346475 A1* | 11/2017 | de Rooij | H01L 27/088 |
| 2018/0114498 A1* | 4/2018 | Li | G09G 3/3677 |
| 2018/0159529 A1* | 6/2018 | Reusch | H03K 17/04206 |
| 2019/0140637 A1* | 5/2019 | Chen | H03K 17/04123 |

\* cited by examiner

CASCADED BOOTSTRAPPING GAN POWER SWITCH AND DRIVER

This application claims the benefit of U.S. Provisional Application No. 62/723,864, filed on Aug. 28, 2018, the entire disclosure of which is hereby incorporated by reference.

BACKGROUND

1. Field of the Invention

The present invention relates generally to high side field effect transistor (FET) gate drivers, and more particularly to a bootstrapping gate driver with quicker turn-on time and better efficiency.

2. Description of the Related Art

Typical high side FET gate drivers rely on a charge pump circuit or a bootstrapping circuit to provide an increased voltage to a gate terminal of the high side FET. Charge pump gate drivers and bootstrapping gate drivers store energy in capacitors while an associated high side FET is turned off and use the stored energy to apply a voltage greater than a supply voltage to the gate terminal of the high side FET, keeping it turned on despite increases in voltage on a source terminal of the high side FET.

FIGS. 1A-B illustrate schematics of conventional charge pump gate drivers for a high side power switch. In FIG. 1A, a system 100 includes a charge pump gate driver 170, a high side power switch transistor 185, and a load 190. Charge pump gate driver 170 is coupled to the gate terminal of power switch transistor 185. The drain terminal of power switch transistor 185 is coupled to the supply voltage source 110 which provides a supply voltage $V_{dd}$, and the source terminal of power switch transistor 185 is coupled to load 190 at output node 195. Charge pump gate driver 170 receives a control signal CTL 105 and drives power switch transistor 185 based on CTL 105. CTL 105 being logic high is indicative that power switch transistor 185 is to be turned off, and CTL 105 being logic low is indicative that power switch transistor 185 is to be turned on. Power switch transistor 185 acts as a closed switch connecting load 190 and supply voltage source 110 based on the output from charge pump gate driver 170 and CTL 105.

Charge pump gate driver 170 includes transistors 120, 135, and 165, resistors 130 and 145, and capacitor 150. The gate terminal of transistor 120 receives CTL 105, and the source terminal of transistor 120 is coupled to a ground node 115. The drain terminal of transistor 120 is coupled to resistor 130 at node 125. Resistor 130 is further coupled to supply voltage source 110. Transistor 120 and resistor 130 make up inverter 155. Capacitor 150 is coupled to node 125 and to the source terminal of transistor 135 at node 140. The gate terminal and the drain terminal of transistor 135 are coupled to supply voltage source 110, configuring transistor 135 as a diode. Resistor 145 is coupled to transistor 135 and capacitor 150 at node 140 and to the drain terminal of transistor 165 at node 160. The gate terminal of transistor 165 receives CTL 105, and the source terminal of transistor 165 is coupled to ground node 115. The gate terminal of power switch transistor 185 is coupled to node 160.

In response to CTL 105 being logic high, transistors 120 and 165 act as closed switches. Transistor 165 connects the gate terminal of power switch transistor 185 to ground, causing power switch transistor 185 to act as an open switch and disconnecting load 190 from supply voltage source 110. Capacitor 150 is charged from supply voltage source 110 via transistors 135 and 120. In response to CTL 105 being logic low, transistors 120 and 165 acts as open switches. Transistor 165, acting as an open switch, disconnects power switch transistor 185 from ground 115, which allows the voltage on node 160 to increase above the threshold voltage $V_{Th}$ of power switch transistor 185 and turn it on.

Power switch transistor 185 then acts as a closed switch and connects load 190 to supply voltage source 110. Pull up resistor 130 causes the voltage on node 125 to increase to approximately the supply voltage $V_{dd}$. Energy stored in capacitor 150 discharges through node 140, increasing the voltage on node 140 and, by extension, the voltage on node 160 above the supply voltage $V_{dd}$. The increased voltage above $V_{dd}$ on node 160 and the low on-resistance of power switch transistor 185 keep power switch transistor 185 turned on as the voltage on its source terminal increases to approximately $V_{dd}$.

In FIG. 1B, a turn-off transistor 180 is incorporated into the system 100 shown in FIG. 1A. The gate terminal of transistor 180 receives CTL 105, and the source terminal of transistor 180 is coupled to ground node 115. The drain terminal of transistor 180 is coupled to output node 195. In response to CTL 105 being logic high, transistor 180 acts as a closed switch, connecting node 195 to ground 115 and quickly decreasing the voltage on node 195 from approximately $V_{dd}$ to ground. Resistors 130 and 145 may be used to balance static currents in charge pump gate driver 170 shown in FIGS. 1A-B during turn-off of power switch transistor 185 with length of turn-on time. Larger resistances for resistors 130 and 145 decrease static currents in charge pump gate driver 170 and reduce the overall power consumption of charge pump gate driver 170, but also slow the turn-on of power switch transistor 185.

FIGS. 2A-B illustrate schematics of conventional bootstrapping gate drivers for a high side power switch. In FIG. 2A, a system 200 includes a bootstrapping gate driver 270, a high side power switch transistor 285, and a load 290. Bootstrapping gate driver 270 is coupled to the gate terminal of power switch transistor 285. The drain terminal of power switch transistor 285 is coupled to a supply voltage source 210 which provides a supply voltage $V_{dd}$, and the source terminal of power switch transistor 285 is coupled to load 290 at output node 295. Bootstrapping gate driver 270 receives a control signal CTL 205 and drives power switch transistor 285 based on CTL 205. CTL 205 being logic high is indicative that power switch transistor 285 is to be turned off, and CTL 205 being logic low is indicative that power switch transistor 285 is to be turned on. Power switch transistor 285 acts as a closed switch, connecting load 290 to supply voltage source 210, based on the output from bootstrapping gate driver 270 and CTL 205.

Bootstrapping gate driver 270 includes transistors 220 and 235, resistor 245, and capacitor 250. The gate terminal of transistor 220 receives CTL 205, and the source terminal of transistor 220 is coupled to a ground node 215. The drain terminal of transistor 220 is coupled to resistor 245 at node 255. Resistor 245 is further coupled to the source terminal of transistor 235 at node 240. The gate terminal and the drain terminal of transistor 235 are coupled to supply voltage source 210, configuring transistor 235 as a diode. Capacitor 250 is coupled between node 240 and output node 295. The gate terminal of power switch transistor 285 is coupled to node 255.

In response to CTL 205 being logic high, transistor 220 acts as a closed switch connecting node 255 to ground node 215, causing power switch transistor 285 to turn off and act as an open switch and disconnecting load 290 from supply voltage source 210. Capacitor 250 is charged from supply voltage source 210 via transistor 235 and transistor 220. In response to CTL 205 being logic low, transistor 220 acts as an open switch, disconnecting node 255 from ground 215. Diode-configured transistor 235 and pullup resistor 245 increase the voltage on node 255 above the threshold voltage $V_{Th}$ of power switch transistor 185 and turn it on.

Power switch transistor 285 then acts as a closed switch and connects load 290 to supply voltage source 210. As the voltage on output node 295 increases, energy stored in capacitor 250 discharges through node 240, pull up resistor 245, and node 255, which increases the voltage on nodes 240 and 255. As the voltage on output node 295 approaches the supply voltage $V_{dd}$, the voltage on node 255 increases to approximately the voltage on output node 295 plus the voltage across capacitor 250, above the supply voltage $V_{dd}$. The increased voltage above $V_{dd}$ on node 255 and the low on-resistance of power switch transistor 285 keep power switch transistor 285 turned on as the voltage on its source terminal increases to approximately $V_{dd}$.

In FIG. 2B, a turn-off transistor 280 is incorporated into the system 200 shown in FIG. 2A. The gate terminal of transistor 280 receives CTL 205, and the source terminal of transistor 280 is coupled to ground node 215. The drain terminal of transistor 280 is coupled to output node 295. In response to CTL 205 being logic high, transistor 280 acts as a closed switch, connecting output node 295 to ground 215 and quickly decreasing the voltage at node 295 from approximately $V_{dd}$ to ground. Like the charge pump gate driver 170 shown in FIGS. 1A-B, bootstrapping gate driver 270 shown in FIGS. 2A-B balances static currents during turn-off of power switch transistor 285 with length of the turn-on time using resistor 245. A larger resistance for resistor 245 decreases static currents in bootstrapping gate driver 270 and reduces the overall power consumption of bootstrapping gate driver 270, but also slows the turn-on of power switch transistor 285.

SUMMARY OF THE INVENTION

The present invention addresses the disadvantages of conventional bootstrapping gate drivers, discussed above, by providing a cascaded bootstrapping gate driver incorporated with gallium nitride (GaN) FET transistor switches, which decreases the resistance of the cascaded bootstrapping gate driver and quickens the turn-on of the associated power switch driven by the cascaded bootstrapping gate driver.

More specifically, the present invention, as described herein, is a cascaded bootstrapping gate driver for a high side power transistor and includes an initial bootstrapping stage comprising a circuit including a resistor to decrease static current consumption and at least one secondary bootstrapping stage with a circuit similar to the circuit of the initial bootstrapping stage, but including a transistor in place of the resistor of the initial bootstrapping stage. The initial bootstrapping stage provides a first driving voltage to the secondary bootstrapping stage, and the secondary bootstrapping stage provides a second driving voltage to the gate terminal of the high side power transistor, the second driving voltage being larger than the first driving voltage.

The GaN FETs in the cascaded bootstrapping gate driver of the present invention are smaller than the high side power transistor and allow the first capacitor to have a lower capacitance than the second capacitor. The reduced on-resistance of the GaN FETs quickens turn-on time and enables the resistor to have a larger resistance and reduced static current consumption, improving efficiency of cascaded bootstrapping gate driver without impacting the turn-on time. The cascaded bootstrapping gate driver of the present invention can include multiple secondary bootstrapping stages.

The above and other preferred features described herein, including various novel details of implementation and combination of elements, will now be more particularly described with reference to the accompanying drawings and pointed out in the claims. It should be understood that the particular methods and apparatuses are shown by way of illustration only and, not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 3:
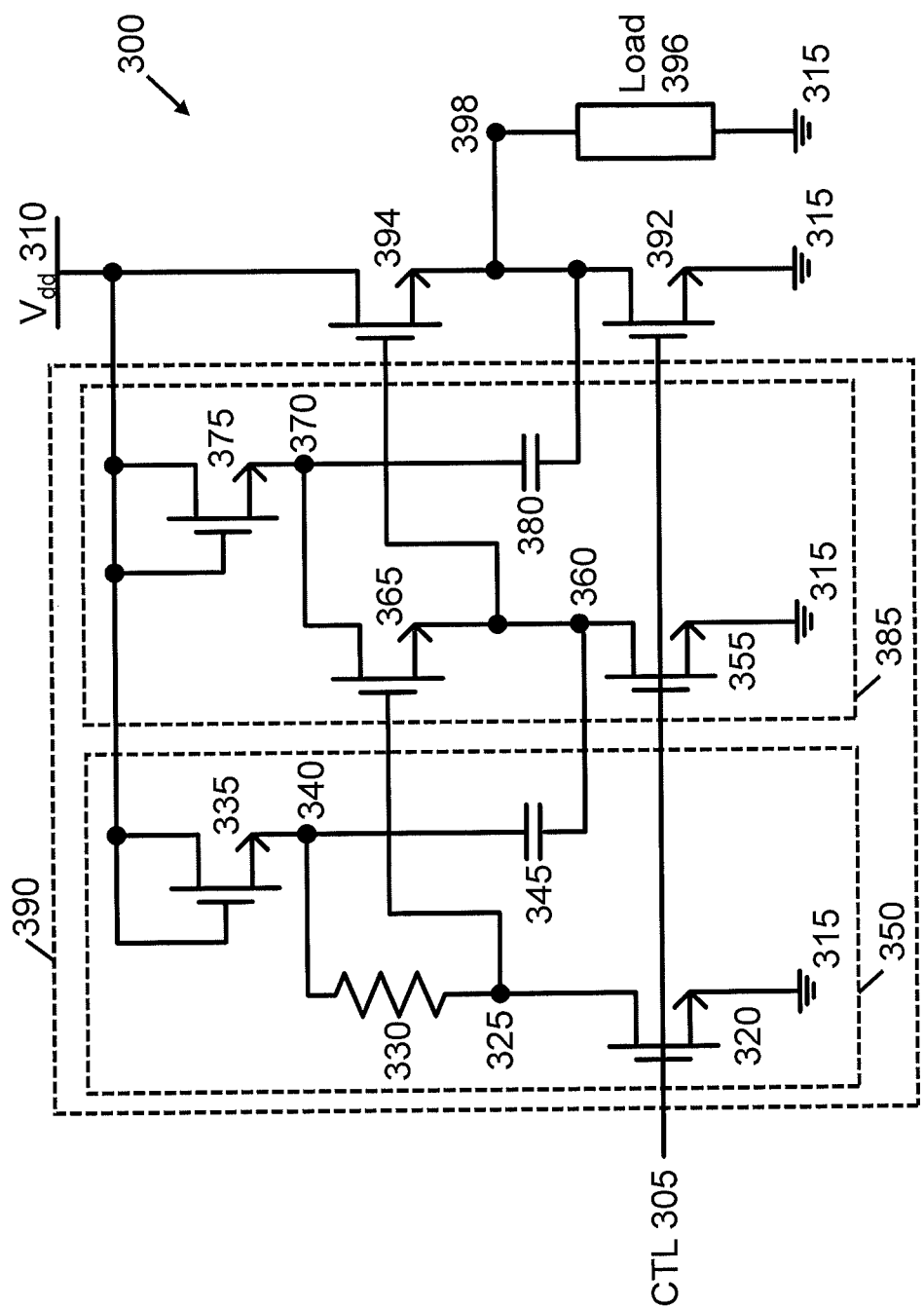
FIG. 3 illustrates a cascaded bootstrapping gate driver for a high side power switch according to a first embodiment of the present invention.

FIG. 3 illustrates a cascaded bootstrapping gate driver 390 for a high side power switch according to a first embodiment of the present invention. The system 300 includes the cascaded bootstrapping gate driver 390, a turn-off transistor 392, a high side power switch transistor 394, and a load 396. Turn-off transistor 392 and power switch transistor 394 are preferably enhancement mode GaN FET semiconductor devices, which are monolithically integrated with cascaded bootstrapping gate driver 390 onto a single semiconductor die. Because GaN FETs are able to carry large currents, support high voltages, and switch more quickly than conventional transistors, turn-off transistor 392 and power switch transistor 394 enable system 300 to provide quicker turn-on and turn-off times than a similar system implementing other transistors, such as MOSFETs.

Cascaded bootstrapping gate driver 390 is coupled to a gate terminal of power switch transistor 394. The drain terminal of power switch transistor 394 is coupled to a supply voltage source 310 which provides a supply voltage $V_{dd}$, and the source terminal of power switch transistor 394 is coupled to load 396 at output node 398. Cascaded bootstrapping gate driver 390 receives a control signal CTL 305 and drives power switch transistor 394 based on CTL 305. CTL 305 being logic high is indicative that power switch transistor 394 is to be turned off, and CTL 305 being logic low is indicative that power switch transistor 394 is to be turned on.

Power switch transistor 394 acts as a closed switch, connecting load 396 to supply voltage source 310 based on the output from cascaded bootstrapping gate driver 390 and CTL 305. The drain terminal of turn-off transistor 392 is coupled to output node 398, and the source terminal of turn-off transistor 392 is coupled to a ground node 315. The gate terminal of turn-off transistor 392 receives a control signal CTL 305. In response to CTL 305 being logic high, turn-off transistor 392 acts as a closed switch connecting output node 398 to ground 315, speeding a decrease in a voltage on output node 398 from approximately $V_{dd}$ to ground.

Cascaded bootstrapping gate driver 390 includes an initial bootstrapping stage 350 and a secondary bootstrapping stage 385. The initial bootstrapping stage 350 includes transistors 320 and 335, a resistor 330, and a capacitor 345. The secondary bootstrapping stage 385 includes transistors 355, 365, and 375 and capacitor 380. Transistors 320, 335, 355, 365, and 375 are preferably enhancement mode GaN FET semiconductor devices, which are monolithically integrated onto a single semiconductor die with the other components of system 300. As described previously herein with reference to turn-off transistor 392 and power switch transistor 394, GaN FETs switch more quickly than conventional transistors and allow cascaded bootstrapping gate driver 390 to turn power switch transistor 394 on and off more quickly than a similar system implementing other transistors, such as MOSFETs. Transistors 320, 335, 355, 365, 375, 392, and 394 have approximately the same threshold voltage $V_{Th}$ and approximately the same maximum gate-to-source voltage $V_{GS(MAX)}$, which is greater than $V_{dd}-V_{Th}$.

In initial bootstrapping stage 350, the gate terminal of transistor 320 receives CTL 305, and the source terminal of transistor 320 is coupled to ground node 315. The drain terminal of transistor 320 is coupled to resistor 330 at node 325. Resistor 330 is further coupled to the source terminal of transistor 335 at node 340. The gate terminal and the drain terminal of transistor 335 are coupled to supply voltage source 310, configuring transistor 335 as a diode. Capacitor 345 is coupled to node 340 and to node 360 in the secondary bootstrapping stage 385.

The secondary bootstrapping stage 385 is similar to initial bootstrapping stage 350 but substitutes transistor 365 for resistor 330. Transistor 365 is chosen to be smaller than power switch transistor 394, and the gate terminal of transistor 365 is driven by initial bootstrapping stage 350. The gate terminal of transistor 355 receives CTL 305, and the source terminal of transistor 355 is coupled to ground node 315. The drain terminal of transistor 355 is coupled to the source terminal of transistor 365 at node 360. The gate terminal of transistor 365 is coupled to node 325 in initial bootstrapping stage 350, and the drain terminal of transistor 365 is coupled to the source terminal of transistor 375 at node 370. The gate terminal and the drain terminal of transistor 375 are coupled to supply voltage source 310, configuring transistor 375 as a diode. Capacitor 380 is coupled to output node 398. The gate terminal of power switch transistor 394 is coupled to node 360.

In response to CTL 305 being logic high, transistors 320, 355 and 392 act as closed switches. Transistor 320, acting as a closed switch, connects node 325 to ground 315, decreasing the voltage on node 325. Transistor 355, acting as a closed switch, connects node 360 to ground 315, decreasing the voltage on node 360. The decreasing voltage on node 325 at the gate terminal of transistor 365 and on node 360 at the source terminal of transistor 365 turns off transistor 365. Turn-off transistor 392, acting as a closed switch, connects output node 398 to ground 315, decreasing the voltage on output node 398. The decreasing voltage on node 360 at the gate terminal of power switch transistor 394 and on output node 398 at the source terminal of power switch transistor 394 turns off power switch transistor 394, disconnecting the load 396 from the supply voltage source 310. Energy is stored in capacitor 345 from the supply voltage source 310 through diode-connected transistor 335 and transistor 355. Similarly, energy is stored in capacitor 380 from the supply voltage source 310 through diode-connected transistor 375 and turn-off transistor 392. The voltages across capacitors 345 and 380 are increased to approximately $V_{dd}-V_{Th}$, due to the threshold voltage drop across the diode-connected transistor 335 or 375, respectively. Static current is drawn only through resistor 330 and transistors 335 and 320.

In response to CTL 305 being logic low, transistors 320, 355, and 392 act as open switches. Transistor 392, acting as an open switch, disconnects output node 398 from ground 315, allowing the voltage on node 398 to increase. Transistor 320, acting as an open switch, disconnects node 325 from ground 315. The initial voltage on node 340 is approximately equal to $V_{dd}-V_{Th}$, due to the threshold voltage drop across transistor 335, and increases the voltage on node 325 through resistor 330. As the voltage on node 325 increases above $V_{Th}$, transistor 365 turns on. Transistor 355, acting as an open switch, disconnects node 360 from ground 315, allowing the voltage on node 360 to increase as transistor 365 turns on and current flows from supply voltage source 310 through transistors 375 and 365 to node 360. As the voltage on node 360 increases above $V_{Th}$, power switch transistor 394 turns on. Power switch transistor 394 then acts as a closed switch and connects load 396 to supply voltage source 310. As the voltage on the output node 398 increases, energy stored in capacitor 380 increases the voltage on node 370 proportionally, such that the voltage on node 370 is approximately equal to the voltage on output node 398 plus $V_{dd}-V_{Th}$. Because transistor 365 is on, the voltage on node 360 is substantially equal to the voltage on node 370 and increases proportional to the increase in voltage on output node 398. As the voltage on node 360 increases, energy stored in capacitor 345 increases the voltage on node 340 proportionally, such that the voltage on node 340 is approximately equal to the voltage on node 340 plus $V_{dd}-V_{Th}$. The increase in voltage on node 340 increases the voltage on node 325 through resistor 330. The increase in voltage on node 325 at the gate terminal of transistor 365 keeps it on as the voltage on node 360 at its source terminal increases. Keeping transistor 365 turned on keeps node 370 and node 360 coupled together, such that the $V_{GS}$ of power switch transistor 394 is substantially equal to the voltage across capacitor 380 and power switch transistor 394 remains turned on as the voltage on output node 398 at its source terminal increases to the supply voltage $V_{dd}$. No static current is drawn.

Figure 1A:
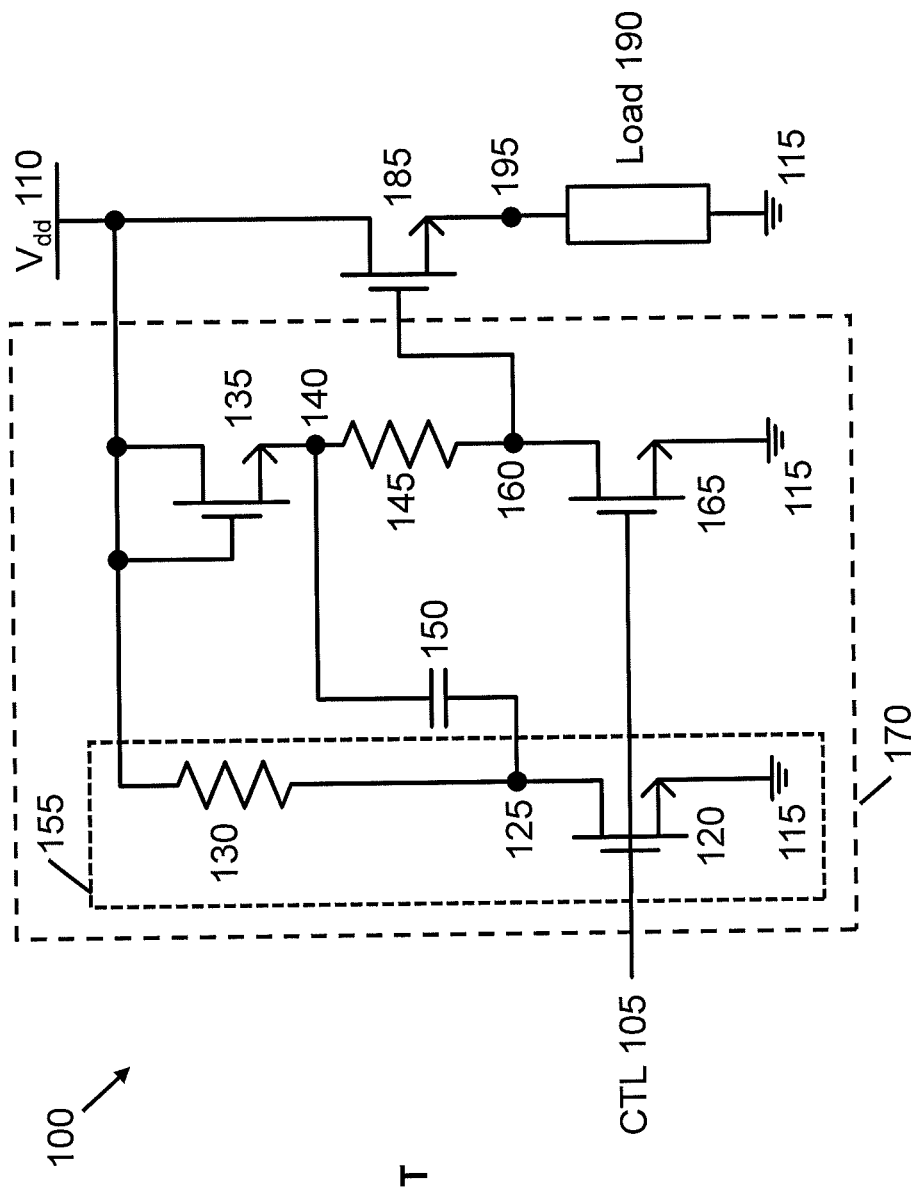
FIGS. 1A-B illustrate schematics of conventional charge pump gate drivers for a high side power switch.
Figure 1B:
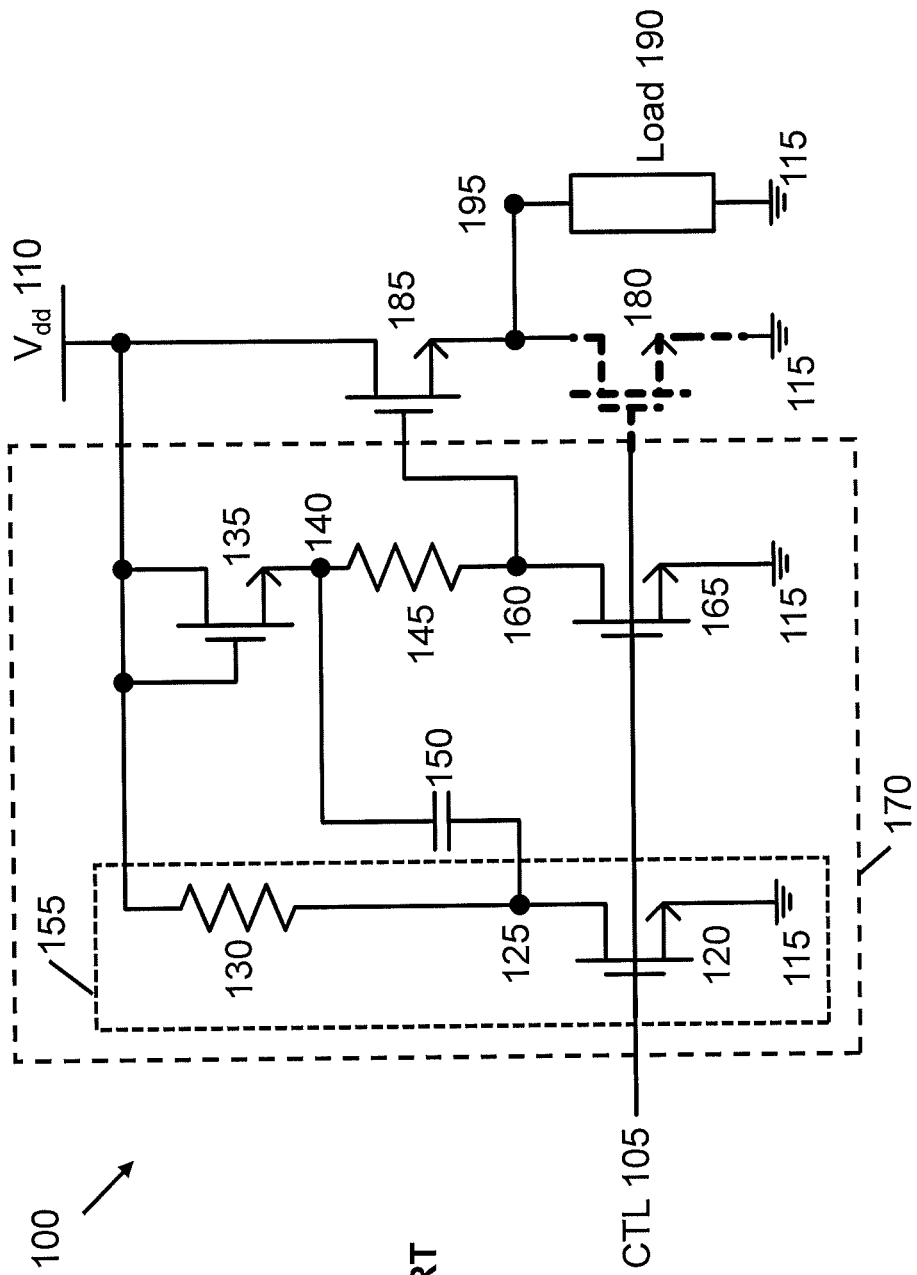
Figure 2A:
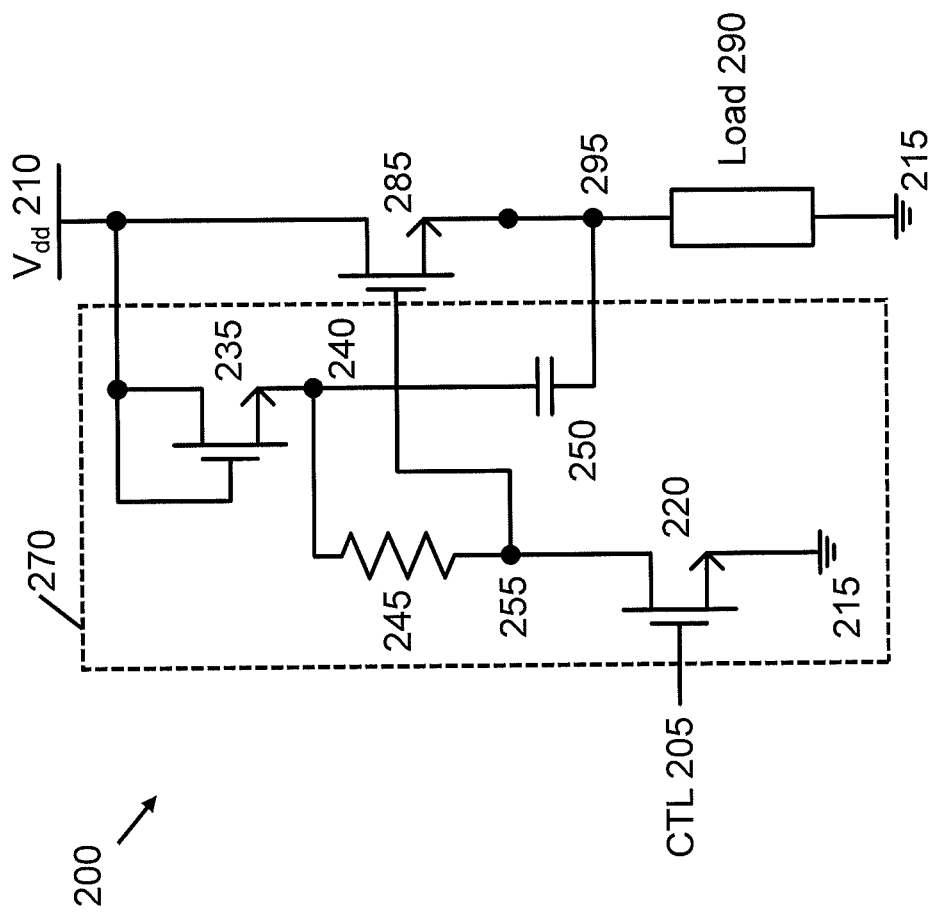
FIGS. 2A-B illustrate schematics of conventional bootstrapping gate drivers for a high side power switch.
Figure 2B:
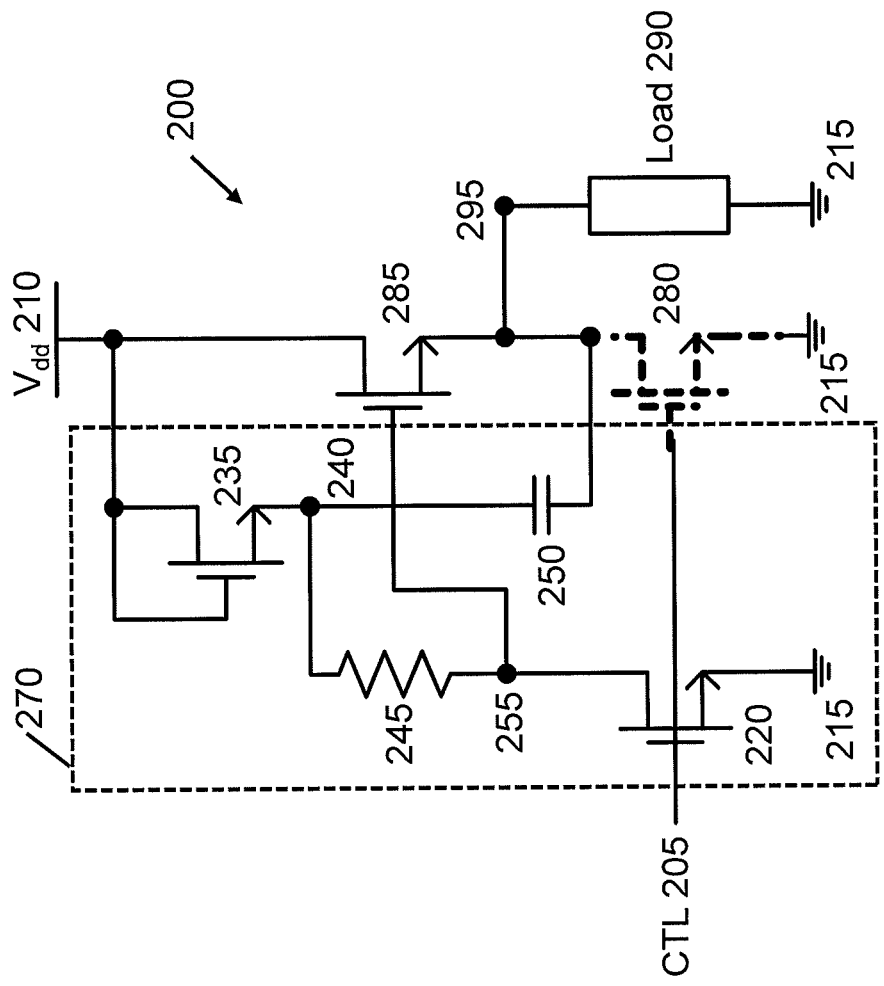

In response to CTL 305 being logic low and transistor 365 acting as a closed switch that couples node 370 and node 360 together, charge on capacitor 380 is redistributed between capacitor 380 and the gate-to-source capacitance of transistor 394, decreasing the voltage across capacitor 380. As a result, the $V_{GS}$ of transistor 394 is less than the initial voltage across capacitor 380 in response to CTL 305 being logic high. In some embodiments, capacitor 380 has a capacitance approximately nine times larger than the gate-to-source capacitance of transistor 394 to maintain approximately 90% of the initial charged voltage on capacitor 380 such that a sufficient $V_{GS}$ is applied to transistor 394. Since transistor 365 is smaller than power switch transistor 394, initial bootstrapping stage 350 provides a smaller driving voltage to transistor 365 than secondary bootstrapping stage 385 provides to the gate terminal of high side power transistor 394, and capacitor 345 can be smaller than capacitor 380. Transistor 365 in secondary bootstrapping stage 385 speeds the turn-on of power switch transistor 394, because the turn-on resistance of transistor 365 is much smaller than the resistance of resistor 245 in bootstrapping gate driver 270 shown in FIGS. 2A-B. The smaller driving voltage from initial bootstrapping stage 350 allows resistor 330 to be larger and reduce the static current more with less of an impact on the turn-on time of transistor 365 and, by extension, the turn-on time of power switch transistor 394, due to the smaller size of transistor 365.

Figure 4:
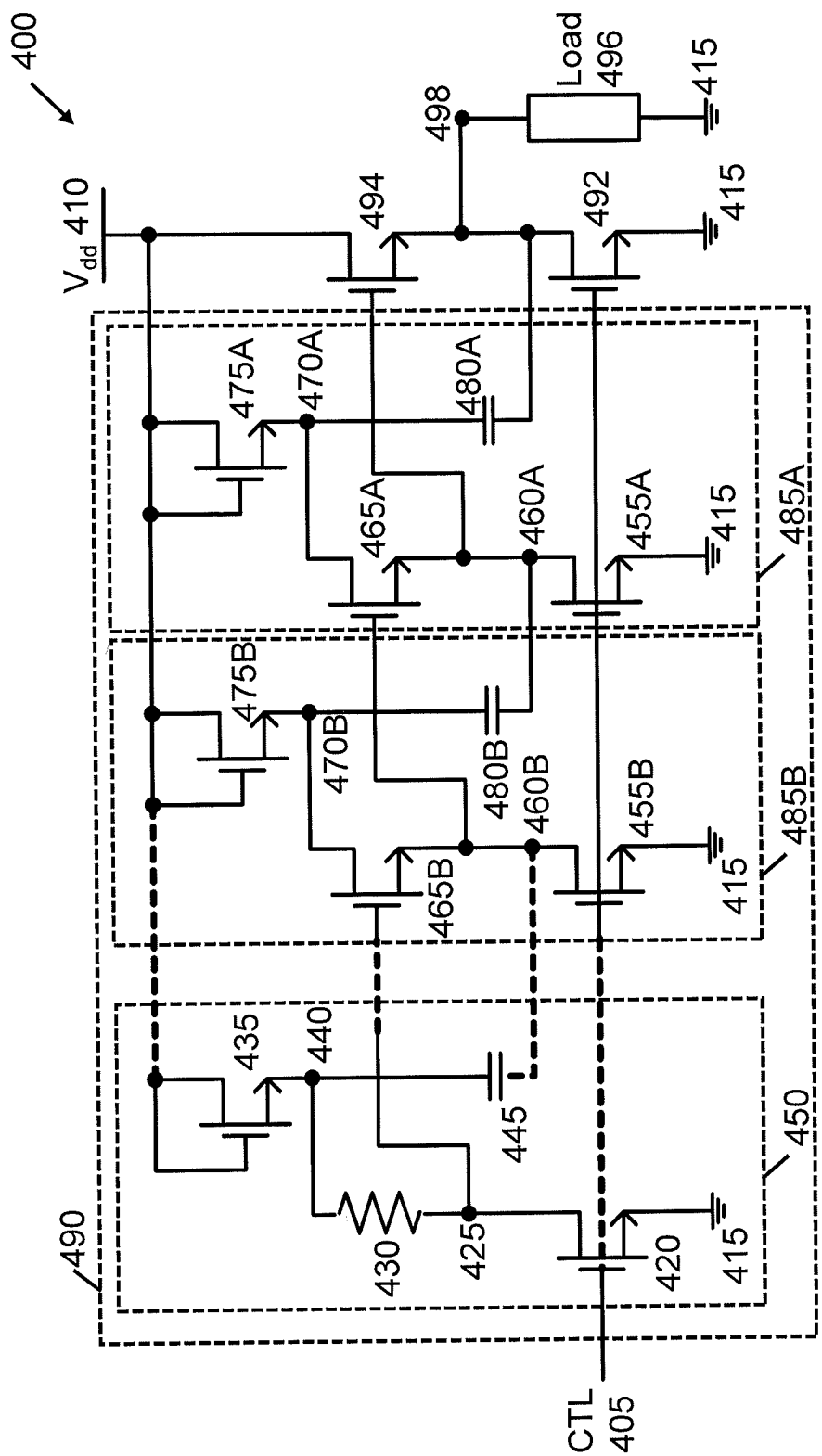
FIG. 4 illustrates a cascaded bootstrapping gate driver for a high side power switch according to the first embodiment of the present invention, including N bootstrapping stages.

FIG. 4 illustrates a cascaded bootstrapping gate driver 490 for a high side power switch according to the first embodiment of the present invention, including a plurality, N, of bootstrapping stages. Cascaded bootstrapping gate driver 490 is similar to cascaded bootstrapping gate driver 390 shown in FIG. 3, but includes N−1 secondary bootstrapping stages 485A-485N−1. Each transistor 465 is driven by the preceding bootstrapping stage, for example transistor 465A is driven by bootstrapping stage 485B. The delay time for turning on power switch transistor 494 increases with the number N of bootstrapping stages.

Each transistor 465 is smaller and has a lower on-resistance than the transistor 465 in the subsequent bootstrapping stage 485. For example, transistor 465B is smaller than transistor 465A, both of which are smaller than power switch transistor 494. Similarly, each capacitor 480 is smaller than the capacitor 480 in the subsequent bootstrapping stage 485. For example, capacitor 480B has a smaller capacitance than capacitor 480A. Initial bootstrapping stage 450 can include the only resistor 430, which can be very large to reduce the static current in response to CTL 405 being logic high and power switch transistor 494 being turned off.

Figure 5:
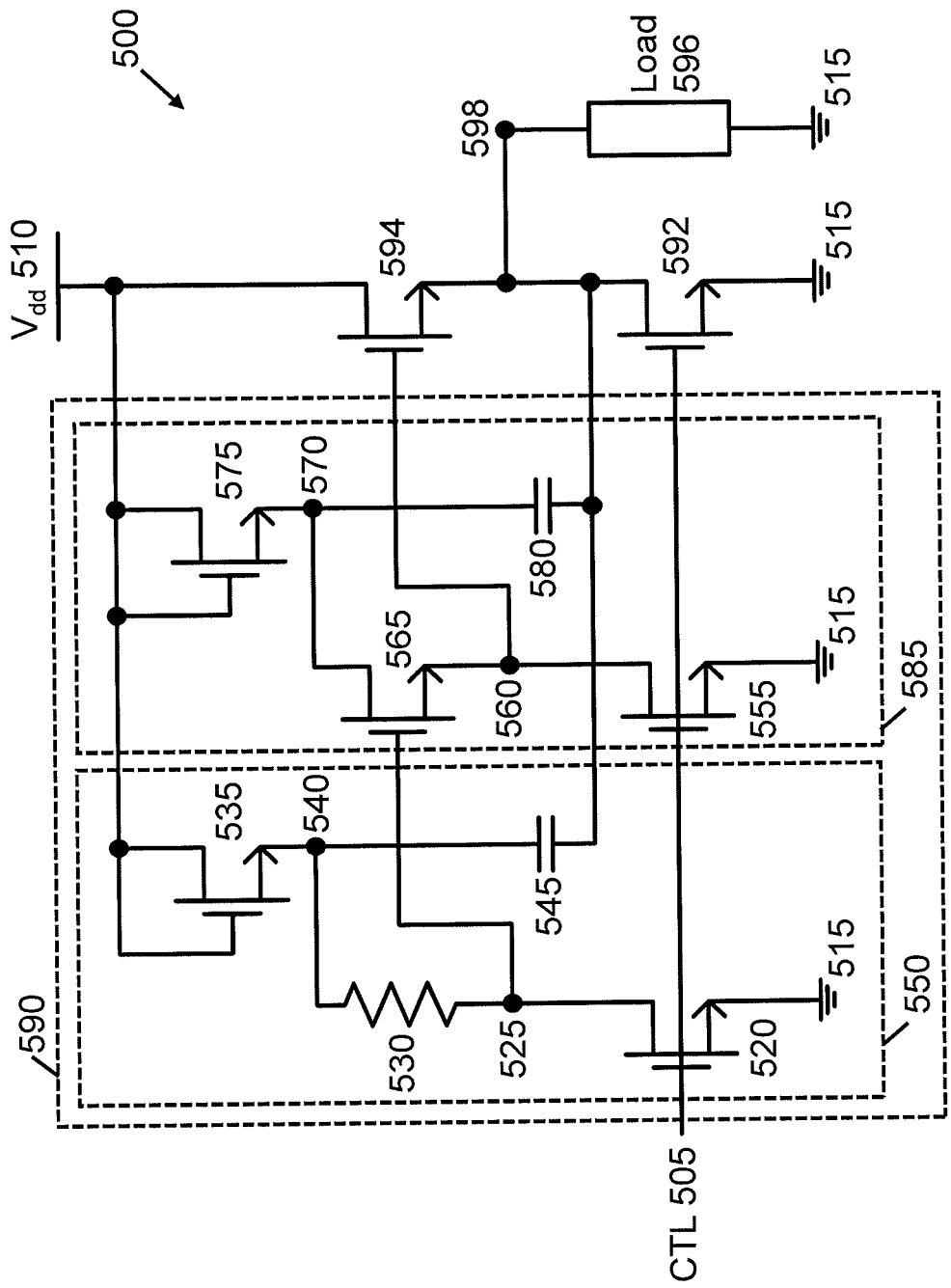
FIG. 5 illustrates a cascaded bootstrapping gate driver for a high side power switch according to a second embodiment of the present invention, in which a supply voltage is greater than a maximum gate-to-source voltage rating of the high side power switch.

FIG. 5 illustrates a cascaded bootstrapping gate driver 590 for a high side power switch according to a second embodiment of the present invention, in which the supply voltage $V_{ddH}$ is greater than a maximum gate-to-source voltage rating $V_{GS(MAX)}$ of the transistors. In this example, $V_{ddH}$ is greater than three times the threshold voltage $V_{Th}$ of the transistors and less than $2V_{GS(MAX)}+V_{Th}$. Device 500 includes cascaded bootstrapping gate driver 590, high side power switch transistor 594, turn-off transistor 592, and a load 596. Turn-off transistor 592 and power switch transistor 594 are preferably enhancement mode GaN FET semiconductor devices, which are monolithically integrated with cascaded bootstrapping gate driver 590 onto a single semiconductor die. Because GaN FETs are able to carry large currents, support high voltages, and switch more quickly than conventional transistors, turn-off transistor 592 and power switch transistor 594 enable system 500 to provide quicker turn-on and turn-off times than a similar system implementing other transistors, such as MOSFETs. Turn-off transistor 592, power switch transistor 594, and transistors in cascaded bootstrapping gate driver 590 have substantially the same threshold voltage $V_{Th}$ and substantially the same $V_{GS(MAX)}$.

Cascaded bootstrapping gate driver 590 is similar to cascaded bootstrapping gate driver 390 shown in FIG. 3, but capacitor 545 is coupled between node 540 and output node 598, unlike capacitor 345, which is coupled between node 340 and node 360. Because capacitor 545 is coupled to output node 598 rather than node 560, the voltage on node 540 is tied to the voltage on output node 598, rather than to the voltage on node 560. Thus, the voltage on node 540 increases based on the voltage on node 598 and the voltage on the source terminal of power switch transistor 594. The initial voltage across capacitor 545 in response to CTL 505 being logic high is redistributed between capacitor 545 and the series gate-to-source capacitances of transistor 565 and transistor 594. The resulting voltage between node 525 and output node 598 is divided across two gate-to-source voltages, i.e., the gate-to-source voltage of transistor 565 and the gate-to-source voltage of power switch transistor 594, rather than only one. The additional voltage division ensures the difference between the voltages on nodes 560 and 598 does not exceed $V_{GS(MAX)}$. Further, because node 560 and capacitor 545 are not coupled together, the voltage on node 560 is driven by transistor 565, which acts as a source follower driving power switch transistor 594, and the voltage on the output node 598 increases to approximately $V_{ddH}$.

In response to CTL 505 being logic high, transistors 520, 555 and 592 act as closed switches. Transistor 520, acting as a closed switch, connects node 525 to ground 515, decreasing the voltage on node 525. Transistor 555, acting as a closed switch, connects node 560 to ground 515, decreasing the voltage on node 560. The decreasing voltage on node 525 at the gate terminal of transistor 565 and on node 560 at the source terminal of transistor 565 turns off transistor 565. Turn-off transistor 592, acting as a closed switch, connects output node 598 to ground 515, decreasing the voltage on output node 598. The decreasing voltage on node 560 at the gate terminal of power switch transistor 594 and on output node 598 at the source terminal of power switch transistor 594 turns off power switch transistor 594, disconnecting the load 596 from the supply voltage source 510. Energy is stored in capacitor 545 from the supply voltage source 510 through diode-connected transistor 535 and transistor 592. Similarly, energy is stored in capacitor 580 from the supply voltage source 510 through diode-connected transistor 575 transistor 592. The voltages across capacitors 545 and 580 are increased to approximately $V_{ddH}-V_{Th}$, due to the threshold voltage drop across the diode-connected transistor 535 or 575, respectively. Static current is drawn only through resistor 530 and transistors 535 and 520.

In response to CTL 505 being logic low, transistors 520, 555, and 592 act as open switches. Transistor 592, acting as an open switch, disconnects output node 598 from ground 515 and allows the voltage on node 598 to increase. Transistor 520, acting as an open switch, disconnects node 525 from ground 515. The initial voltage on node 540 is approximately equal to $V_{ddH}-V_{Th}$, due to the threshold voltage drop across transistor 535, and increases the voltage on node 525 through resistor 530. As the voltage on node 525 increases above $V_{Th}$, transistor 565 turns on. Transistor 555, acting as an open switch, disconnects node 560 from ground 515, allowing the voltage on node 560 to increase as transistor 565 turns on and current flows from supply voltage source 510 through transistors 575 and 565 to node 560. As the voltage on node 560 increases above $V_{Th}$, power switch transistor 594 turns on. Power switch transistor 594 then acts as a closed switch and connects load 596 to supply voltage source 510. As the voltage on output node 598 increases, energy stored in capacitors 580 and 545 increases the voltages on nodes 570 and 540 proportionally, such that the voltages on nodes 570 and 540 are approximately equal to the voltage on output node 598 plus $V_{ddH}$–$V_{Th}$. The increase in voltage on node 540 increases the voltage on node 525 through resistor 530. The voltage across capacitor 545 is approximately equal to the $V_{GS}$ of transistor 565 plus the $V_{GS}$ of transistor 594. As a result, the initial voltage across capacitor 545 is approximately equal to $V_{ddH}$–$V_{Th}$ in response to CTL 505 being logic high, and is divided across two gate-to-source voltages, the gate-to-source voltages of transistors 565 and 594, such that the gate-to-source voltages of transistors 565 and 594 do not exceed $V_{GS(MAX)}$. The increase in voltage on node 525 at the gate terminal of transistor 565 keeps the transistor on as the voltage on node 560 at its source terminal increases, which causes transistor 565 to act as a source follower and allows the charge stored in capacitor 580 to increase the voltage on node 560. The voltage on node 560 increases proportionally to the voltage on node 525, which, in turn, increases proportionally to the voltage on the output node 598, keeping transistor 594 turned on as the voltage on output node 598 at its source terminal increases to approximately $V_{ddH}$ and the load 596 is connected to the supply voltage 510.

Transistors 520, 535, 555, 565, and 575 are preferably enhancement mode GaN FET semiconductor devices, which are monolithically integrated onto a single semiconductor die with the other components of system 500. As described previously herein with reference to turn-off transistor 592 and power switch transistor 594, GaN FETs switch more quickly than conventional transistors and allow cascaded bootstrapping gate driver 590 to turn power switch transistor 594 on and off more quickly than a similar system implementing other transistors, such as MOSFETs. Since transistor 565 has a lower on-resistance than power switch transistor 594, initial bootstrapping stage 550 provides a smaller driving voltage to transistor 565 than secondary bootstrapping stage 585 provides to the gate terminal of high side power transistor 594, and, like resistor 330 in cascaded bootstrapping gate driver 390 shown in FIG. 3, resistor 530 in cascaded bootstrapping gate driver 590 can have a larger resistance and reduce the static current more with less of an impact on the turn-on time of transistor 565 and, by extension, the turn-on time of power switch transistor 594 due to the smaller size of transistor 565 compared to power switch transistor 594.

Figure 6:
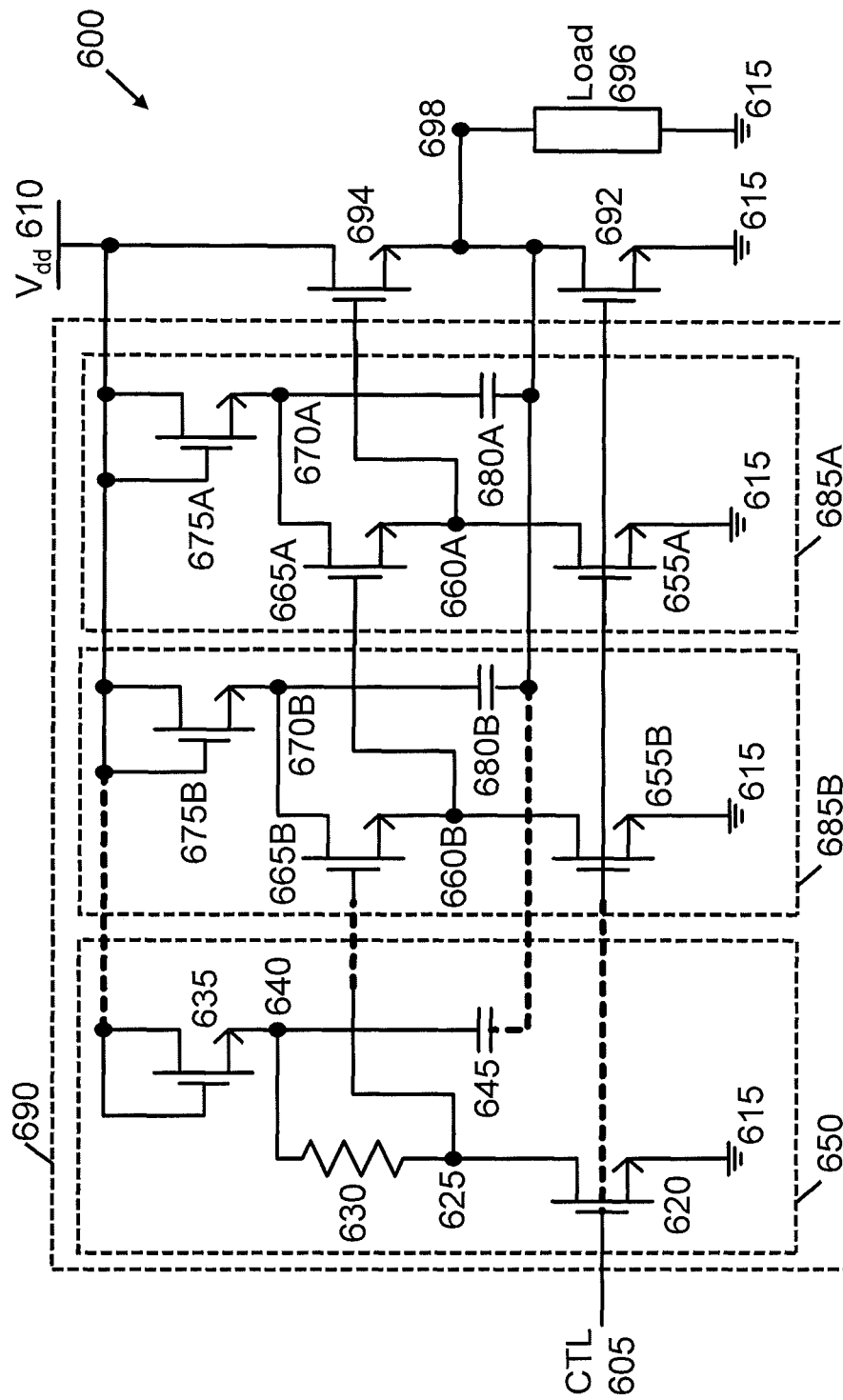
FIG. 6 illustrates a cascaded bootstrapping gate driver for a high side power switch according to the second embodiment of the present invention, including N bootstrapping stages.

FIG. 6 illustrates a cascaded bootstrapping gate driver 690 for a high side power switch according to the second embodiment of the present invention, including a plurality, N, of bootstrapping stages. Cascaded bootstrapping gate driver 690 is similar to cascaded bootstrapping gate driver 590 shown in FIG. 5, but includes N−1 secondary bootstrapping stages 685A-685N−1. In this example, the supply voltage $V_{ddH}$ is greater than a maximum gate-to-source voltage rating $V_{GS(MAX)}$ of the transistors in system 600. $V_{ddH}$ is greater than $(N+1)V_{Th}$ and less than $NV_{GS(MAX)}$+ $V_{Th}$. The delay time for turning on power switch transistor 694 increases with the number N of bootstrapping stages.

Each transistor 665 is driven by the preceding bootstrapping stage. For example, transistor 665A is driven by bootstrapping stage 686B. Each transistor 665 is smaller and has a lower on-resistance than the transistor 665 in the subsequent bootstrapping stage 685. For example, transistor 665B is smaller than transistor 665A, both of which are smaller than power switch transistor 694. Similarly, each capacitor 680 is smaller than the capacitor 680 in the subsequent bootstrapping stage 685. For example, capacitor 680B is smaller than capacitor 680A. Initial bootstrapping stage 650 can include the only resistor 630, which can be very large in order to reduce the static current in response to CTL 605 being logic high and power switch transistor 694 being turned off.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A cascaded bootstrapping gate driver for a high side power transistor having a drain terminal connected to a supply voltage, a source terminal connected to an output, and a gate terminal, the cascaded bootstrapping gate driver comprising:
   an initial bootstrapping stage comprising a circuit including a bootstrap capacitor, and a resistor to decrease static current consumption; and
   at least one secondary bootstrapping stage comprising the circuit of the initial bootstrapping stage, but including a transistor in place of the resistor of the initial bootstrapping stage;
   wherein the initial bootstrapping stage provides a first driving voltage to the secondary bootstrapping stage, and the secondary bootstrapping stage provides a second driving voltage to the gate terminal of the high side power transistor, wherein the second driving voltage is larger than the first driving voltage.

2. The cascaded bootstrapping gate driver of claim 1, wherein the initial bootstrapping stage comprises:
   a first gallium nitride (GaN) field effect transistor (FET) having a gate terminal connected to an input node, a source terminal connected to ground, and a drain terminal connected to a first node;
   a resistor having a first terminal connected to the first node and a second terminal connected to a second node;
   a second GaN FET having a source terminal connected to the second node, and a gate terminal and a drain terminal connected together to the supply voltage; and
   a first capacitor having a first terminal connected to the second node and a second terminal connected to the gate terminal of the high side power transistor, wherein the first capacitor comprises the bootstrap capacitor of the initial bootstrapping stage; and
   wherein the secondary bootstrapping stage comprises:
   a third GaN FET having a gate terminal connected to the input node, a source terminal connected to ground, and a drain terminal connected to the gate terminal of the high side power transistor;
   a fourth GaN FET having a gate terminal connected to the first node, a source terminal connected to the gate terminal of the high side power transistor, and a drain terminal connected to a third node, wherein the fourth GaN FET comprises the transistor in place of the resistor of the initial bootstrapping stage;

a fifth GaN FET having a source terminal connected to the third node, and a gate terminal and a drain terminal connected together to the supply voltage; and a second capacitor having a first terminal connected to the third node and a second terminal connected to the output, wherein the second capacitor comprises the bootstrap capacitor of the secondary bootstrapping stage.

3. The cascaded bootstrapping gate driver of claim 2, wherein the first, second, third, fourth, and fifth GaN FETs are enhancement mode GaN FETs.

4. The cascaded bootstrapping gate driver of claim 2, wherein the supply voltage is less than a maximum gate-to-source voltage rating of the first, second, third, fourth, and fifth GaN FETs plus a threshold voltage for the GaN FETs.

5. The cascaded bootstrapping gate driver of claim 2, wherein the fourth GaN FET is smaller than the high side power transistor.

6. The cascaded bootstrapping gate driver of claim 1, further comprising at least one additional secondary bootstrapping stage connected between the secondary bootstrapping stage and the high side power transistor, wherein the additional secondary bootstrapping stage comprises the circuit of the secondary bootstrapping stage, wherein the secondary bootstrapping stage provides the second driving voltage to the additional secondary bootstrapping stage and the additional secondary bootstrapping stage provides an additional second driving voltage to the gate terminal of the high side power transistor, wherein the additional second driving voltage is larger than the second driving voltage.

7. The cascaded bootstrapping gate driver of claim 6, wherein the additional secondary bootstrapping stage comprises:

an additional third GaN FET having a gate terminal connected to the input node, a source terminal connected to ground, and a drain terminal connected to the gate terminal of the high side power transistor;

an additional fourth GaN FET having a gate terminal connected to the drain terminal of the third GaN FET and the source terminal of the fourth GaN FET, a source terminal connected to the gate terminal of the high side power transistor, and a drain terminal connected to a fourth node, wherein the additional fourth GaN FET comprises the transistor in place of the resistor of the initial bootstrapping stage;

an additional fifth GaN FET having a source terminal connected to the fourth node, and a gate terminal and a drain terminal connected together to the supply voltage; and an additional second capacitor having a first terminal connected to the fourth node and a second terminal connected to the output, wherein the additional second capacitor comprises the bootstrap capacitor of the additional secondary bootstrapping stage.

8. The cascaded bootstrapping gate driver of claim 7, wherein the additional fourth GaN FET is smaller than the high side power transistor, wherein the fourth GaN FET is smaller than the additional fourth GaN FET, and wherein the second capacitor is smaller than the additional second capacitor.

9. The cascaded bootstrapping gate driver of claim 1, wherein the initial bootstrapping stage comprises:

a first gallium nitride (GaN) field effect transistor (FET) having a gate terminal connected to an input node, a source terminal connected to ground, and a drain terminal connected to a first node;

a resistor having a first terminal connected to the first node and a second terminal connected to a second node;

a second GaN FET having a source terminal connected to the second node, and a gate terminal and a drain terminal connected together at the supply voltage; and a first capacitor having a first terminal connected to the second node and a second terminal connected to the output, wherein the first capacitor comprises the bootstrap capacitor of the initial bootstrapping stage; and wherein the secondary bootstrapping stage comprises:

a third GaN FET having a gate terminal connected to the input node, a source terminal connected to ground, and a drain terminal connected to the gate terminal of the high side power transistor;

a fourth GaN FET having a gate terminal connected to the first node, a source terminal connected to the gate terminal of the high side power transistor, and a drain terminal connected to a third node, wherein the fourth GaN FET comprises the transistor in place of the resistor of the initial bootstrapping stage;

a fifth GaN FET having a source terminal connected to the third node, and a gate terminal and a drain terminal connected together to the supply voltage; and a second capacitor having a first terminal connected to the third node and a second terminal connected to the output, wherein the second capacitor comprises the bootstrap capacitor of the secondary bootstrapping stage.

10. The cascaded bootstrapping gate driver of claim 9, wherein the first, second, third, fourth, and fifth GaN FETs are enhancement mode GaN FETs.

11. The cascaded bootstrapping gate driver of claim 9, wherein the supply voltage is less than N times a maximum gate-to-source voltage rating of the GaN FETs plus a threshold voltage for the GaN FETs and greater than (N+1) times the threshold voltage for the GaN FETs, where N represents a number of stages in the cascaded bootstrapping gate driver.

12. The cascaded bootstrapping gate driver of claim 9, wherein a voltage across the first capacitor is divided across a gate-to-source voltage of the fourth GaN FET and a gate-to-source voltage of the high side power transistor.

13. The cascaded bootstrapping gate driver of claim 9, wherein the fourth GaN FET is smaller than the high side power transistor.

14. The cascaded bootstrapping gate driver of claim 9, further comprising at least one additional secondary bootstrapping stage connected between the secondary bootstrapping stage and the high side power transistor, wherein the additional secondary bootstrapping stage comprises the circuit of the secondary bootstrapping stage, wherein the secondary bootstrapping stage provides the second driving voltage to the additional secondary bootstrapping stage and the additional secondary bootstrapping stage provides an additional second driving voltage to the gate terminal of the high side power transistor, wherein the additional second driving voltage is larger than the second driving voltage.

15. The cascaded bootstrapping gate driver of claim 14, wherein the additional secondary bootstrapping stage comprising:

an additional third GaN FET having a gate terminal connected to the input node, a source terminal connected to ground, and a drain terminal connected to the gate terminal of the high side power transistor;

an additional fourth GaN FET having a gate terminal connected to the drain terminal of the third GaN FET and the source terminal of the fourth GaN FET, a source terminal connected to the gate terminal of the high side power transistor, and a drain terminal connected to a fourth node, wherein the additional fourth GaN FET comprises the transistor in place of the resistor of the initial bootstrapping stage;

an additional fifth GaN FET having a source terminal connected to the fourth node, and a gate terminal and a drain terminal connected together to the supply voltage; and an additional second capacitor having a first terminal connected to the fourth node and a second terminal connected to the output, wherein the additional second capacitor comprises the bootstrap capacitor of the additional secondary bootstrapping stage.

16. The cascaded bootstrapping gate driver of claim 15, wherein the additional fourth GaN FET is smaller than the high side power transistor, wherein the fourth GaN FET is smaller than the additional fourth GaN FET, and wherein the second capacitor is smaller than the additional second capacitor.

* * * * *